United States Patent
Cheifetz et al.

(10) Patent No.: US 9,673,019 B2
(45) Date of Patent: Jun. 6, 2017

(54) ELECTRON DETECTION SYSTEM

(71) Applicant: EL-MUL TECHNOLOGIES LTD., Rehovot (IL)

(72) Inventors: Eli Cheifetz, Ramat Gan (IL); Amir Weingarten, Ramat Gan (IL); Semyon Shofman, Kiryat Ekron (IL)

(73) Assignee: EL-MUL TECHNOLOGIES LTD., Rehovot (IL)

(*) Notice: Subject to any disclaimer, the term of this patent is extended or adjusted under 35 U.S.C. 154(b) by 0 days.

(21) Appl. No.: 14/859,391

(22) Filed: Sep. 21, 2015

(65) Prior Publication Data

US 2016/0086765 A1 Mar. 24, 2016

Related U.S. Application Data (60) Provisional application No. 62/053,252, filed on Sep. 22, 2014.

(51) Int. Cl.
| | |
|---|---|
| H01J 37/00 | (2006.01) |
| H01J 37/147 | (2006.01) |
| H01J 37/285 | (2006.01) |
| H01J 37/08 | (2006.01) |
| H01J 37/244 | (2006.01) |
| H01J 37/317 | (2006.01) |

(52) U.S. Cl.
CPC .......... *H01J 37/1472* (2013.01); *H01J 37/08* (2013.01); *H01J 37/244* (2013.01); *H01J 37/285* (2013.01); *H01J 37/317* (2013.01); *H01J 2237/15* (2013.01); *H01J 2237/2448* (2013.01); *H01J 2237/2806* (2013.01); *H01J 2237/31749* (2013.01)

(58) Field of Classification Search
USPC .............. 250/396 R, 397, 398, 399, 396 ML
See application file for complete search history.

(56) References Cited

U.S. PATENT DOCUMENTS

| | | | |
|---|---|---|---|
| 4,841,143 A | 6/1989 | Tamura et al. | |
| 5,146,089 A | 9/1992 | Rosien | |
| 5,990,483 A | 11/1999 | Shariv et al. | |
| 6,236,053 B1 | 5/2001 | Shariv | |

(Continued)

FOREIGN PATENT DOCUMENTS

| | | |
|---|---|---|
| DE | 4000579 | 7/1991 |
| EP | 2175473 | 4/2010 |

(Continued)

*Primary Examiner* — Nicole Ippolito
*Assistant Examiner* — Hanway Chang
(74) *Attorney, Agent, or Firm* — Daniel J. Swirsky; AlphaPatent Associates Ltd.

(57) ABSTRACT

An electron detection system for detecting secondary electrons emitted from a sample irradiated by a Focused Ion Beam (FIB). The FIB emanates from a FIB column and travels along a beam axis within a beam region, which extends from the FIB column to the sample. The system comprises an electron detector configured for detecting the secondary electrons, and a deflecting field configured to deflect a trajectory of the secondary electrons, which were propagating towards the FIB column, to propel away from the beam axis and towards the electron detector. The deflecting field may be configured to divert the trajectory of secondary electrons while the secondary electrons are generally within the beam region.

23 Claims, 7 Drawing Sheets

(56) References Cited

U.S. PATENT DOCUMENTS

| | | |
|---|---|---|
| 6,630,667 B1 | 10/2003 | Wang et al. |
| 6,900,447 B2 | 5/2005 | Gerlach et al. |
| 7,180,060 B2 | 2/2007 | Chefetz et al. |
| 7,417,235 B2 | 8/2008 | Schon et al. |
| 7,847,268 B2 | 12/2010 | Shofman et al. |
| 8,222,600 B2 | 7/2012 | Zarchin et al. |
| 8,907,305 B2 | 12/2014 | Kneedler et al. |
| 2008/0067396 A1* | 3/2008 | Ohshima ............... H01J 37/143 250/396 ML |
| 2009/0309021 A1 | 12/2009 | Schon et al. |
| 2013/0126730 A1 | 5/2013 | Khursheed et al. |

FOREIGN PATENT DOCUMENTS

| | | |
|---|---|---|
| WO | WO2005015599 | 2/2005 |
| WO | WO2006120005 | 11/2006 |
| WO | WO2009144727 | 12/2009 |

\* cited by examiner

ELECTRON DETECTION SYSTEM

CROSS-REFERENCE TO RELATED APPLICATIONS

This Application claims priority benefit from U.S. Provisional Application No. 62/053,252, filed Sep. 22, 2014, the disclosure of which is incorporated herein by reference in its entirety.

TECHNICAL FIELD

This disclosure relates generally to systems for detecting charged particles emitted from a sample and, more particularly, to detecting secondary electrons emitted from a sample irradiated by a focused ion beam (FIB).

BACKGROUND

The FIB instrument comprises an ion beam that is scanned over a sample. Secondary electrons emit from the sample due to the interaction of the ion beam with the sample surface. Detection of the secondary electrons can be used to obtain high spatial resolution images. In most commercially available systems of FIBS, gallium ions are used, and their sputtering action enables precise machining and milling of samples.

SUMMARY

The following summary of the invention is included in order to provide a basic understanding of some aspects and features of the disclosure. This summary is not an extensive overview of the disclosure and as such it is not intended to particularly identify key or critical elements of the disclosure or to delineate the scope of the disclosure. Its sole purpose is to present some concepts of the disclosure in a simplified form as a prelude to the more detailed description that is presented below.

There is provided according to some embodiments of the present disclosure, an electron detection system for detecting secondary electrons emitted from a sample irradiated by a Focused Ion Beam (FIB), the FIB emanating from a FIB column and traveling along a beam axis within a beam region, which extends from the FIB column to the sample, comprising: an electron detector configured for detecting the secondary electrons, the electron detector positioned at a lateral distance away from the FIB column, and a deflecting field configured to deflect a trajectory of the secondary electrons, which were propagating towards the FIB column, to propel away from the beam axis and towards the electron detector, the deflecting field being configured to divert the trajectory of secondary electrons while the secondary electrons are generally within the beam region.

In some embodiments, the deflecting field comprises a magnetic field or an electric field. The magnetic field may be generated by a permanent magnet assembly. The permanent magnet assembly may comprise at least a pair of mutually spaced apart permanent magnets. In some embodiments, the magnetic field may be generated by a coil assembly. The coil assembly may comprise at least a pair of mutually spaced apart coils. In some embodiments, the electric field comprises an electrical conductor.

In some embodiments, the deflecting field is generally orthogonal to the beam axis. The deflecting field may comprise a magnetic field generated by at least a pair of magnets or coils and the magnetic field is generally confined to a space defined intermediate the pair of magnets or coils. The deflecting field may be configured such that its effect on the FIB is negligent or correctable. The deflecting field may be generated by a deflecting assembly, the deflecting assembly may be physically coupled to the FIB column. The deflecting field may be generated by a deflecting assembly, the deflecting assembly may be engaged with a holder of the sample, or with the electron detector.

An intensity of the deflecting field may be adjusted to be compatible with a selected working distance between the FIB column and the sample. An intensity of the deflecting field may be adjusted to be compatible with a selected FIB parameter.

There is provided according to some embodiments of the present disclosure, an electron detection system for detecting secondary electrons emitted from a sample irradiated by a Focused Ion Beam (FIB), the FIB emanating from a FIB column and traveling along a beam axis within a beam region, which extends from the FIB column to the sample, the secondary electrons being detected by an electron detector positioned at a lateral distance away from the FIB column, comprising: a deflecting field assembly configured to deflect a trajectory of the secondary electrons, which were propagating towards the FIB column, to propel away from the beam axis and towards the electron detector.

There is provided according to some embodiments of the present disclosure, a Focused Ion Beam (FIB) system, comprising a FIB column generating a FIB traveling along a beam axis within a beam region, which extends from the FIB column to a sample irradiated by the FIB, an electron detector configured for detecting secondary electrons emitted from the sample, the electron detector positioned at a lateral distance away from the FIB column, and a deflecting field assembly configured to generate a deflecting field which deflects a trajectory of the secondary electrons, which were propagating towards the FIB column, to propel away from the beam axis and towards the electron detector, the deflecting field assembly being configured to divert the trajectory of secondary electrons while the secondary electrons are generally within the beam region.

There is provided according to some embodiments of the present disclosure, a method for detecting secondary electrons in a FIB system having a FIB emanating from a FIB column, comprising: placing an electron detector at a lateral distance away from the FIB column, and generating an electron deflection field to divert the secondary electrons towards the electron detector, the electron deflection field magnitude is configured for generating a Larmor radius for the secondary electrons that is less than 1% of the Larmor radius of the FIB.

In some embodiments, the electron deflection field magnitude is configured to cause a FIB shift that is less than about 0.01% of a working distance between the FIB column and a sample emitting the secondary electrons.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

DETAILED DESCRIPTION

In the following description, various aspects of the present invention will be described with reference to different embodiments. For purposes of explanation, specific configurations and details are set forth in order to provide a thorough understanding of the present invention. However, it will also be apparent to one skilled in the art that the present invention may be practiced without the specific details presented herein. Furthermore, well known features may be omitted or simplified in order not to obscure the present invention.

Figure 1:
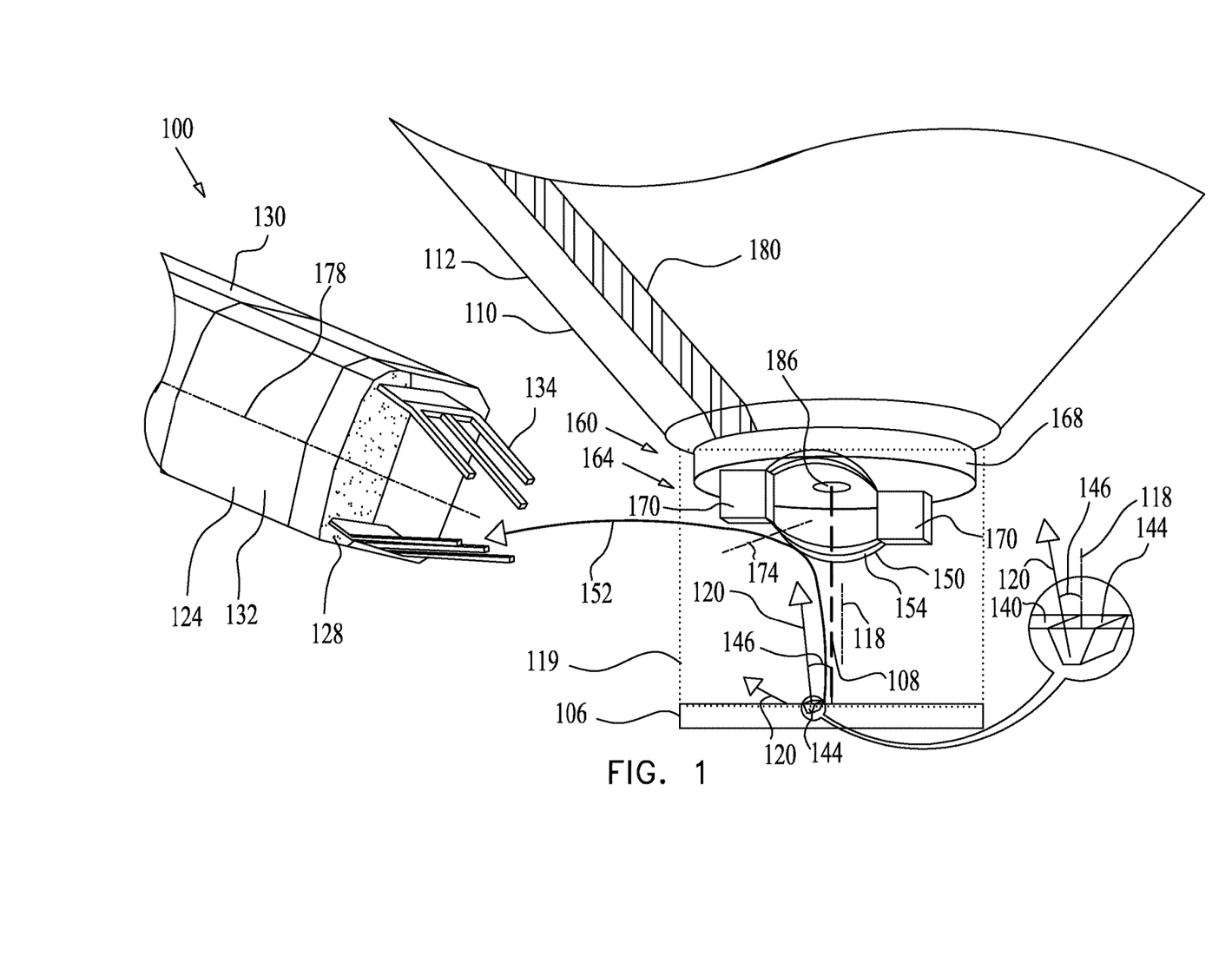
FIG. 1 is a simplified pictorial illustration of an electron detection system constructed and operative in accordance with an embodiment of the present disclosure.

FIG. 1 is a simplified pictorial illustration of an electron detection system constructed and operative in accordance with an embodiment of the present disclosure. As seen in FIG. 1, an electron detection system 100 is configured to detect electrons emitted from a sample 106. The sample 106 is irradiated by a FIB 108 emanating from a pole piece 110 of a FIB column 112 and forming a beam path along a beam axis 118. The beam axis 118 extends within a beam region 119, which is an area spanning from the pole piece 110 of the FIB column 112 to the sample 106 and the vicinity of this area.

In FIG. 1 the sample 106 is shown to underlie the FIB column 112. The sample 106 may be positioned at any suitable inclination (i.e. angle) relative to the FIB 108.

In some embodiments, the FIB 108 may be used for precise milling, nano fabrication and/or imaging the sample 106.

Irradiating the sample 106 by FIB 108 stimulates emission of charged particles from the sample 106. The emitted particles comprise positive ions, negative ions, neutrals, and electrons including secondary electrons 120, emitted from the sample 106 at a plurality of dispersion angles. In some embodiments, some secondary electrons 120 may be emitted at a dispersion angle sufficient for reaching an electron detector 124.

In some embodiments, the secondary electrons comprise electrons emitted from the sample at energies below 50V, with most electrons emitted at energies between 1V-6V.

The electron detector 124 is configured to detect electrons impinging thereupon and yield an electrical signal therefrom. In some embodiments, the electron detector 124 comprises a scintillator surface 128 typically biased at between approximately 2 kV to 20 kV relative to the sample 106. The scintillator surface 128 may be coupled to a light sensor, such as a photomultiplier tube (PMT) 130 via a light guide 132, thereby yielding an electrical signal from an electron impinging upon the scintillator surface 128. It is appreciated that any apparatus for detecting electrons may be employed. In a non-limiting example, a Microchannel-Plate (MCP), a solid state detector, an avalanche photo diode, a PIN diode, a PN diode, a NP diode, a silicon drift diode, or a silicon photomultiplier, may be employed.

The electron detector 124 may be characterized by its collection efficiency, defined by the fraction of emitted electrons which are actually collected by the detector. In some embodiments, the electron detector 124 may comprise a collection grid 134 positioned facing towards the sample 106. The collection grid 134 is configured to enhance the collection efficiency and mitigate the effect of the scintillator voltage on the ion beam, by being biased at lower voltages than the scintillator. The collection grid 134 is typically biased at about 100V to 2 kV, for example.

In some embodiments, the collection grid 134 is configured to attract secondary electrons 120, whereupon the secondary electrons 120 have exited the beam region 119 and advanced towards a vicinity of the collection grid 134. The collection grid 134 may be formed in any suitable configuration, such as an electron permeable sparse grid allowing the electrons to pass through the grid to the detector 124. In some instances the collection grid 134 may be obviated.

In some embodiments, the electron detector 124 is positioned at a lateral distance away from the FIB column 112, as seen in FIGS. 1-4. In some embodiments the electron detector 124 is positioned in close proximity to an exit aperture of the FIB column 112.

The sample 106 may be formed of a substantially flat upper surface 140 and/or with topographical variations such as hills, valleys, tranches, holes and/or vias, collectively referred to as vias 144 in this disclosure. The vias 144 may be present in the sample 106 or may be milled by the FIB 108. Ion milling, nanofabrication and/or surface imaging may be monitored by detecting secondary electrons 120 emitted upon the impingement of the FIB 108 on the sample surface. The milling and nanofabrication is caused by the sputtering of atoms from the impinging FIB 108. The quantity and emission angle of the secondary electron 120 for a particular FIB species depends on the impinged atomic species and an impingement angle of the FIB 108 on the sample surface.

In some embodiments, some secondary electrons 120 may be emitted from the substantially flat upper surface 140. In some embodiments, secondary electrons 120 are emitted from the vias 144 generally at acute angles 146 relative to the beam axis 118, as seen in the insert of FIG. 1. This variation in number of emitted secondary electrons and emission angle enables imaging the topography of the sample surface including the vias 144, as well as variations in the materials forming the sample 106. Such secondary electrons 120 emitted from the vias 144 are of interest in determining when layers of different materials are reached while milling into the sample 106. For example, in semiconductor device fabrication, it is important to stop milling upon reaching a substrate layer. Reaching the substrate layer can be determined by monitoring the changes in the amount of detected secondary electrons 120.

The FIB column 112 comprises an electrostatic objective lens placed at the bottom of the FIB column 112 and is configured to focus the FIB 108 onto the sample 106. The electrostatic objective lens comprises a plurality of electrodes. The electrode structure may attract secondary electrons 120 emitted towards the FIB column 112. In some embodiments, a portion of the secondary electrons 120 emitted from the vias 144, generally at acute angles 146, tend to be attracted to the FIB column 112. Accordingly, most secondary electrons may fail to reach the electron detector 124 due to any one of the following causes: due to the acute emission angle 146 from via 144 or due to emission at angles in which secondary electrons 120 are blocked or absorbed by the via walls or trench walls, or due to emission at angles, which cause the secondary electrons 120 to miss the detector 124 since they are not attracted to the electric field of the detector 124; and/or due to attraction of secondary electrons from flat surface 140 and/or from via 144 and/or from any other surface of the sample 106 at any angle to the FIB column 112.

According to an embodiment of the present disclosure, a deflecting field 150 may be provided and configured to deflect a trajectory 152 of the secondary electrons 120 away from the beam axis 118 and towards the electron detector 124. In some embodiments, the deflecting field 150 is configured to divert the trajectory 152 while the trajectory 152 is still within the beam region 119.

Figure 2:
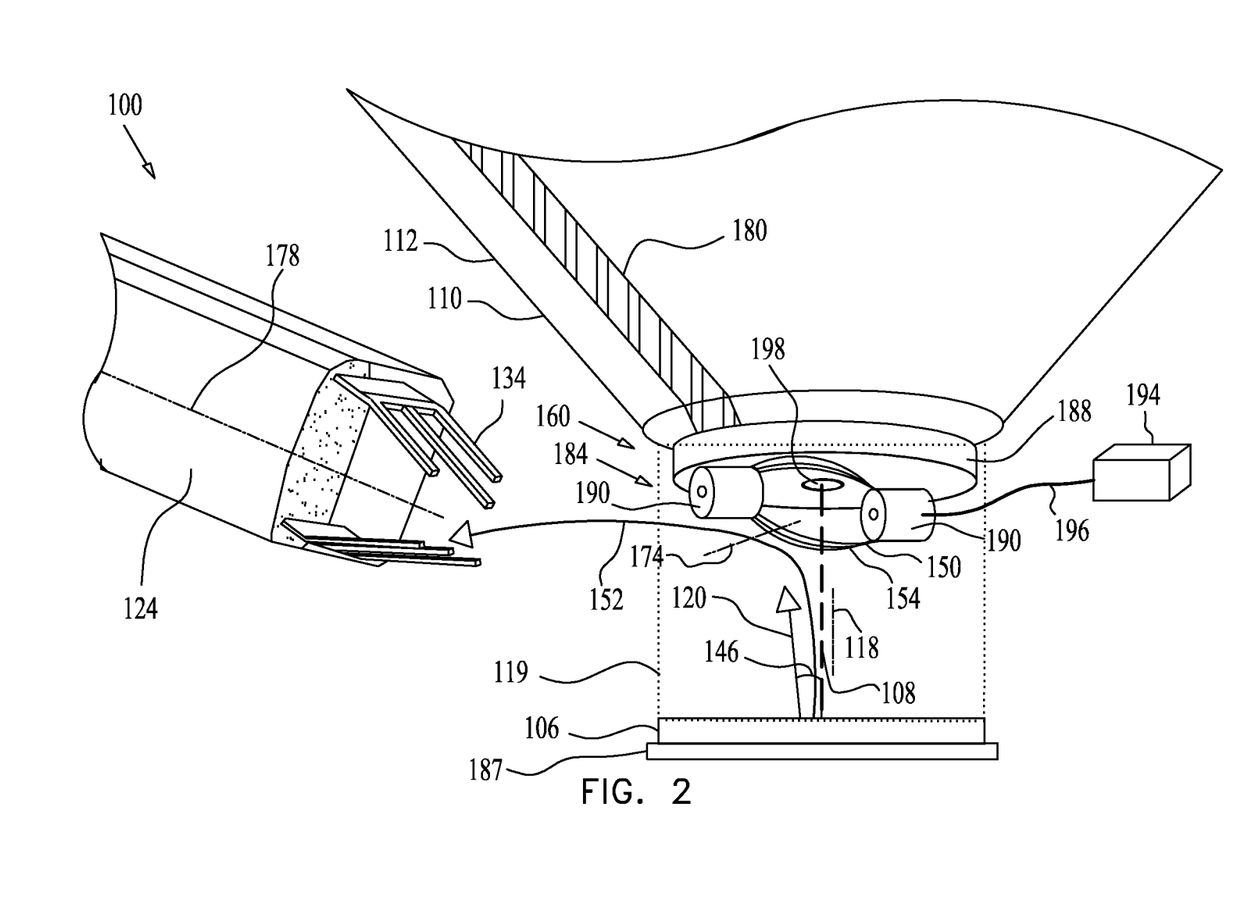
FIG. 2 is a simplified pictorial illustration of an electron detection system constructed and operative in accordance with an embodiment of the present disclosure.
Figure 3:
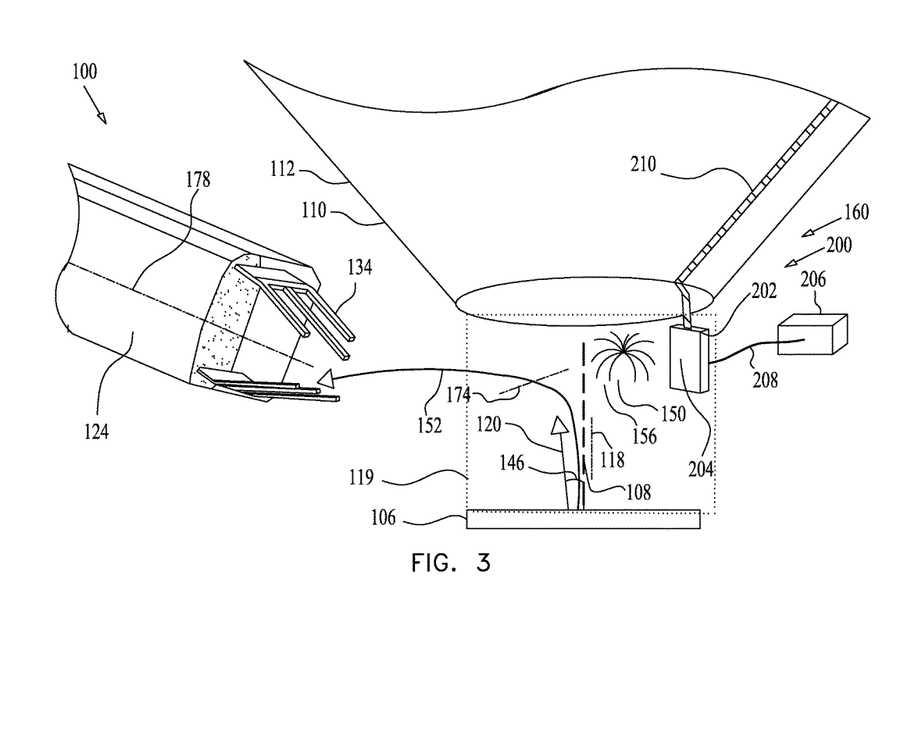
FIG. 3 is a simplified pictorial illustration of an electron detection system constructed and operative in accordance with an embodiment of the present disclosure.

The deflecting field 150 may comprise any suitable field such as a magnetic field 154 shown in FIGS. 1 and 2 and/or an electric field 156 shown in FIG. 3. The deflecting field 150 may be generated by a deflecting assembly 160. As seen in FIG. 1, the deflecting assembly 160 may comprise a permanent magnet assembly 164 formed in any suitable configuration for generating a magnetic field.

The permanent magnet assembly 164 may comprise an annular plate 168 formed of any suitable ferromagnetic material, such as soft iron. A single magnet or a plurality of magnets, such as a pair of mutually spaced apart permanent magnets 170, may extend downwardly from plate 168 and may be arranged with opposing magnetic poles. The permanent magnets 170 may be formed of any suitable material, such as neodymium iron boron (NdFeB), samarium cobalt or barium ferrite, for example. The pair of permanent magnets 170 may be spaced apart by a predetermined distance therebetween. The predetermined distance may be in a range of approximately 4 mm to 20 mm, for example. In a non-limiting example, the distance may be 8 mm.

The magnetic field 154 may be generated intermediate the pair of permanent magnets 170 arranged such that the magnetic field 154 is generated at an axis 174, which is generally orthogonal to the beam axis 118 and generally orthogonal to a longitudinal axis 178 of the electron detector 124. The trajectory 152 of secondary electrons 120 is deflected by the magnetic field 154 to shift its orientation from propagating towards the FIB column 112, along beam axis 118, to propel towards the electron detector 124, along axis 178. Accordingly, secondary electrons 120, which absent the deflecting field 150 would propagate towards the FIB column 112 and thus fail to reach the electron detector 124, are deflected by the deflecting field 150. The deflected secondary electrons 120 are propelled towards the electron detector 124, significantly increasing the collection efficiency of the electron detector 124.

The deflecting field 150 may be generated at any suitable location within the detection system 100, such as in proximity to FIB column 112, and/or within beam region 119, as seen in FIGS. 1-3 or in the vicinity thereof.

In some embodiments, the permanent magnet assembly 164 may be provided as an auxiliary structure to the FIB column 112. In some embodiments, the permanent magnet assembly 164 may be physically coupled to the FIB column 112. This is shown in FIG. 1, wherein the plate 168 is affixed to a bottom surface of the pole piece 110 in any suitable manner, such as by arms 180 engaged with the FIB column 112 by screws, a snap-fit attachment or any other suitable attachment means. The plate 168 may be formed with a central aperture 186 for allowing the FIB 108 to propagate therethrough.

In some embodiments, the deflecting assembly 160 may be engaged (e.g. by being physically attached by an arm) with other components, such as with a sample holder 187 (FIG. 2) of the sample 106, or with the secondary electron detector 124, or with any other component within the chamber housing the FIB column 112 within a FIB system.

In some embodiments, the magnetic field 154 is generated intermediate the pair of permanent magnets 170. By confining the magnetic field 154 to a space defined intermediate the pair of permanent magnets 170, and/or by selecting relatively small sized permanent magnets 170 to generate a weak magnetic field, the magnetic field 154 may have a negligent or relatively small effect on the propagation of the FIB 108. In a non-limiting example, the magnetic field 154 has a magnetic flux density in the range of about 10-200 Gauss. In a non-limiting example, the magnetic field 154 has a magnetic flux density in the range of about 30-100 Gauss. In a non-limiting example, the magnetic field 154 has a magnetic flux density in the range of about 30-50 Gauss.

In some embodiments, shifting of the FIB 108 due to the magnetic field 154 may be corrected by operation of a deflection octopole component, typically housed in the FIB column 112.

A Larmor radius is defined as the radius of the circular motion of a charged particle in the presence of a uniform magnetic field. In a non-limiting example, a magnetic field with a magnetic flux density peak of 30 Gauss, induces for secondary electrons emitted at 6 eV, a Larmor radius of 2.5 mm. This is significantly smaller than a 105 meter Larmor radius induced by a gallium FIB accelerated at 30 keV. In general, the deflection field 150 may be configured to generate a Larmor radius for the secondary electrons 120 that is less than 1% of the Larmor radius of the FIB 108, or less than 0.1% of the Larmor radius of the FIB 108, or less than 0.01% of the Larmor radius of the FIB 108, or less than 0.001% of the Larmor radius of the FIB 108, or less than 0.0001% of the Larmor radius of the FIB According to an embodiment, the magnitude of the deflection field 150, less any correction produced by the FIB column 112, is configured to cause a resultant FIB shift from the beam axis 118 that is less than one micrometer over the working distance between the FIB column 112 and the sample 106. In some embodiments, the magnitude of the deflection field is configured to cause a FIB shift that is less than about 0.01% of the working distance.

The intensity of the magnetic field 154 generated by the magnets 170 may be adjustable by adding or removing permanent magnets or a ferromagnetic material, such as soft iron, between the pair of magnets 170. Thus, the magnitude of the magnetic flux density of the magnetic field 154 may be adjusted in accordance with any one of the: FIB parameters (e.g. the energy or the ion type of the FIB 108); and/or in accordance with the topology and material of the sample 106; and/or in accordance with the working distance between the FIB column 112 and the sample 106. For example, the magnetic flux density may be reduced for a longer working distance, and may be increased for a shorter working distance. In some embodiments there may be provided an assortment of permanent magnet assemblies 164. Each assembly 164 may comprise a magnetic material and/or number of magnets configured for generating a magnetic field at a selected magnitude of magnetic flux density.

In some embodiments, generating the magnetic field 154 by permanent magnet assembly 164 may be advantageous since there is no requirement for additional wiring or power supply.

Turning to FIG. 2 it is seen that the deflecting assembly 160 may comprise a coil assembly 184 formed in any suitable configuration for generating a magnetic field.

The coil assembly 184 may comprise an annular plate 188 formed of any suitable material such as a ferromagnetic material, e.g. iron. A single coil or a plurality of coils, such as a pair of mutually spaced apart coils 190, may underlie plate 188. The coils 190 may comprise spirals, helix or coils winding a core formed in any suitable manner. In a non-limiting example, the pair of coils 190 may each be formed with 200 turns of a 0.1 mm diameter of impregnated copper wire around a soft iron core of a one mm diameter.

The pair of coils 190 may be spaced apart at any suitable predetermined distance. In a non-limiting example, the distance may be in the range of 4 mm to 20 mm. In a non-limiting example, the distance may be about 8 mm.

Upon driving a current through the coils 190 by a power supplier 194 through electrical wires 196, the magnetic field 154 is generated. As described in reference to FIG. 1, the magnetic field 154 is generated intermediate the pair of coils 190. The coils 190 may be arranged such that the magnetic field 154 is generated at axis 174. As seen in FIG. 2, the trajectory 152 is deflected by the magnetic field 154 to shift its orientation from propagating towards the FIB column 112 to propel towards the electron detector 124. Accordingly, secondary electrons 120, which absent the deflecting field 150 would propagate towards the FIB column 112 and thus fail to reach the electron detector 124, are deflected by the deflecting field 150. Thereby the collection efficiency of the electron detector 124 may be significantly increased.

In some embodiments, the coil assembly 184 may be provided as an auxiliary structure to the FIB column 112. In some embodiments, the coil assembly 184 may be physically coupled to the FIB column 112, such as seen in FIG. 2. For example, the plate 188 may be affixed to a bottom surface of the pole piece 110 in any suitable manner, such as by the arms 180 engaged with the FIB column 112. The plate 188 may be formed with a central aperture 198 for allowing the FIB 108 to propagate therethrough.

In some embodiments, the intensity of the magnetic field 154 generated by the coils 190 may be adjustable by supplying a selected current. Thus, the magnetic flux density may be adjusted according to the FIB parameters and/or to the topology and material of the sample 106 and/or according to the working distance between the FIB column 112 and the sample 106. For example, the magnetic flux density may be reduced for a longer working distance, and may be increased for a shorter working distance. In some embodiments, no current may be supplied and thus the magnetic field 154 is not generated.

As seen in FIG. 3, the deflecting field 150 may comprise the electric field 156. The deflecting assembly 160 may comprise an electric deflecting assembly 200 formed in any suitable configuration for generating an electric field.

The electric deflecting assembly 200 may comprise an electrical conductor, such as a plurality or a single electrode 202 formed in any suitable shape, such as a ring or a polygon, and of any suitable conductive material, such as stainless steel or copper. The electrode 202 may be arranged with its front surface 204 generally orthogonal to the longitudinal axis 178 of the electron detector 124.

Upon charging the electrode 202 by a power supplier 206 through electrical wires 208, the electric field 156 is generated. As seen in FIG. 3, the trajectory 152, is deflected by the electric field 156 to shift its orientation from propagating towards the FIB column 112 to propel towards the electron detector 124. Accordingly, secondary electrons 120, which absent the deflecting field 150 would propagate towards the FIB column 112 and thus fail to reach the electron detector 124, are deflected by the deflecting field 150. Thereby the collection efficiency of the electron detector 124 may be significantly increased.

In some embodiments, the electric deflecting assembly 200 may be provided as an auxiliary structure to the FIB column 112. In some embodiments, the electric deflecting assembly 200 may be physically coupled to the FIB column 112. For example, the electrode 202 may be affixed via an insulator (e.g. plastic) to a bottom surface of the pole piece 110 in any suitable manner, such as by an arm 210 engaged with the FIB column 112 by screws or any other suitable attachment means.

The electrode 202 may be positioned in any suitable location, such as underlying the pole piece 110, as seen in FIG. 3, or in any other suitable location.

The intensity of the electric field 156 may be adjustable by supplying a selected voltage. Thus, the electric field intensity may be adjusted to the FIB 108 parameters and/or to the topology and material of the sample 106 and/or according to the working distance between the FIB column 112 and the sample 106. In some embodiments, no current may be supplied and thus the electric field 156 is not generated.

In some embodiments, by biasing the electrode 202 with a relatively low voltage, the electric field 156 may have a negligent or relatively small effect on the propulsion of the FIB 108. In a non-limiting example, the electrode 202 is biased with a voltage in a range of approximately 1V to 100V. In some embodiments, shifting of the FIB 108 may be corrected by operation of the deflection octopole component, typically housed in the FIB column 112.

Figure 4:
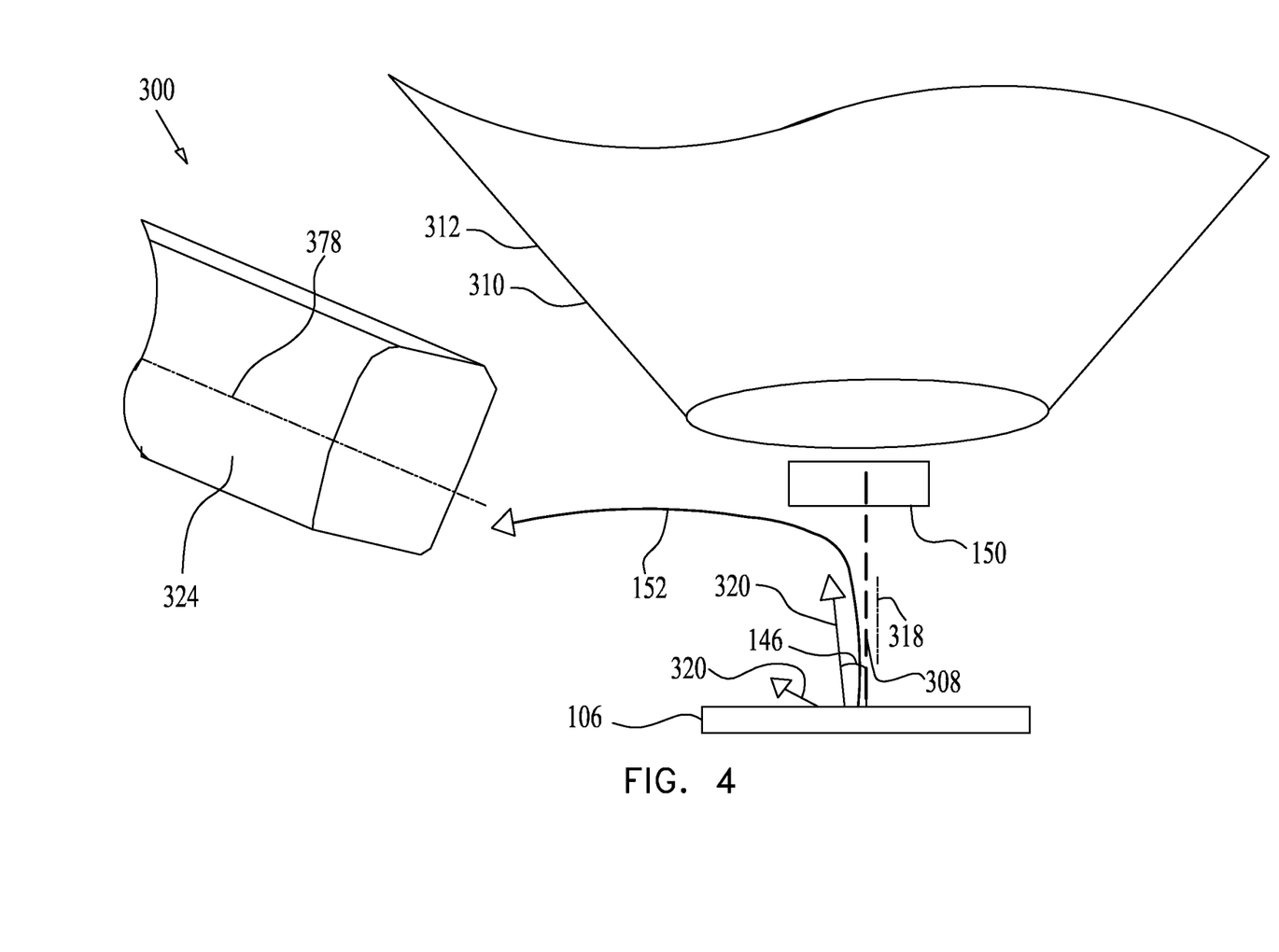
FIG. 4 is a simplified pictorial illustration of an electron detection system constructed and operative in accordance with an embodiment of the present disclosure.

FIG. 4 is a simplified pictorial illustration of a charged particle detection system constructed and operative in accordance with an embodiment of the present disclosure. As seen in FIG. 4, a charged particle detection system 300 is configured to detect charged particles emitted from the sample 106. The sample 106 may be irradiated by a particle beam 308 emanating from a pole piece 310 of a particle beam column 312 and forming a beam path along a beam axis 318 defined between the pole piece 310 and the sample 106. In FIG. 4 the sample 106 is shown to underlie the column 312, though it is appreciated that the sample 106 may be positioned at any suitable location within the detection system 300.

In some embodiments, particle beam 308 may comprise a focused ion beam (FIB), a helium beam or any other suitable particle beam.

Irradiating the sample 106 by beam 308 stimulates emission of charged particles 320 from the sample 106. The emitted particles may comprise positive ions, negative ions, neutrals and electrons, including secondary electrons (SE) and/or back scattered electrons (BSE), emitted from the sample 106 at a plurality of dispersion angles. In some embodiments, some charged particles 320 may be emitted at a dispersion angle allowing these charged particles 320 to reach a charged particle detector 324.

The charged particle detector 324 is configured to detect charged particles impinging thereupon and yield an output signal therefrom. In some embodiments, the charged particle detector 324 may comprise the electron detector 124 of FIGS. 1-3. In some embodiments the charged particle detector 324 may comprise an electron detector positioned intermediate the particle beam column 312 and the sample 106. In some embodiments the charged particle detector 324 may comprise a positive or negative ion detector formed in any suitable manner. As described in FIGS. 1-3, the sample 106 may be formed of a substantially flat upper surface 140 and/or with topographical variations such as hills, valleys, tranches, holes and/or vias 144. Ion milling, nanofabrication and/or surface imaging may be monitored by detecting charged particles 320 emitted upon the impingement of the beam 308 on the sample surface. In some embodiments, a portion of the charged particles 320 emitted from vias 144, generally at acute angles, may fail to reach the charged particle detector 324.

The deflecting field 150 may be provided and configured to deflect a trajectory 152 of the charged particles 320 away from the beam axis 318 and towards the charged particle 324.

The trajectory 152 of charged particles 320, emitted from the sample 106, is deflected by the deflecting field 150 to shift its orientation from propagating towards the beam column 312, along beam axis 318, to propelling towards the charged particle detector 324, along its longitudinal axis 378. Accordingly, charged particles 320, which absent the deflecting field 150 would propagate towards the beam column 312 and thus fail to reach the charged particle detector 324, are deflected by the deflecting field 150. The deflected charged particles 320 are propelled towards the charged particle detector 324. Thereby the collection efficiency of the charged particle detector 324 may be significantly increased.

The deflecting field 150 may be generated at any suitable location within the detection system 300, such as in proximity to beam column 312, as seen in FIGS. 1-3.

Figure 5A:
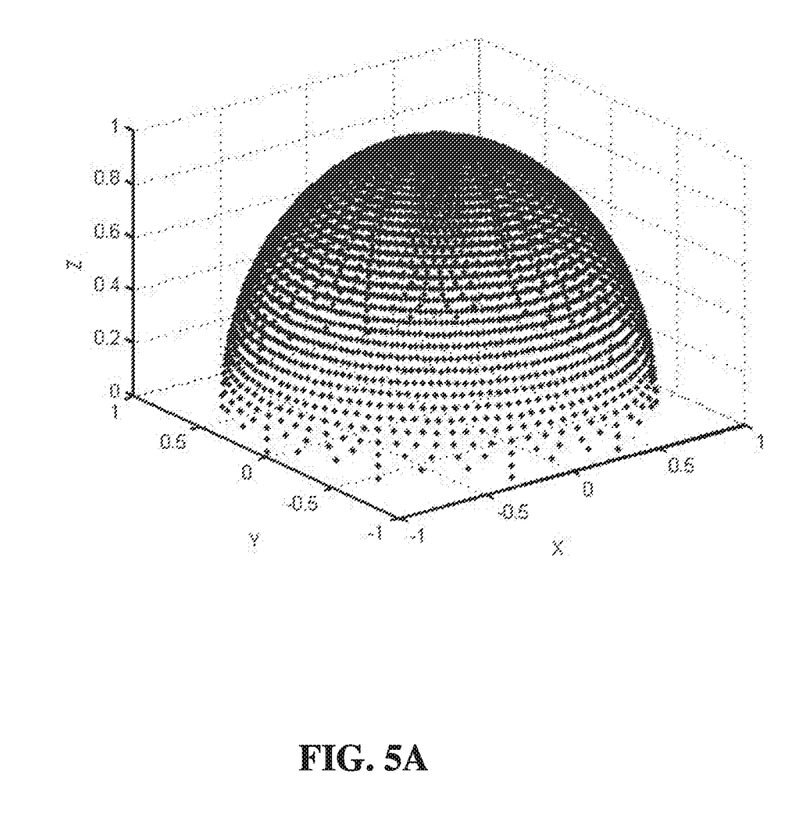
FIGS. 5A, 5B and 5C are simplified graphical illustrations of electrons detected by an electron detector within a hypothetical system (FIG. 5A), electrons detected by an electron detector within an electron detection system of FIG. 1 (FIG. 5B) and electrons detected by an electron detector within a standard FIB system (FIG. 5C).
Figure 5B:
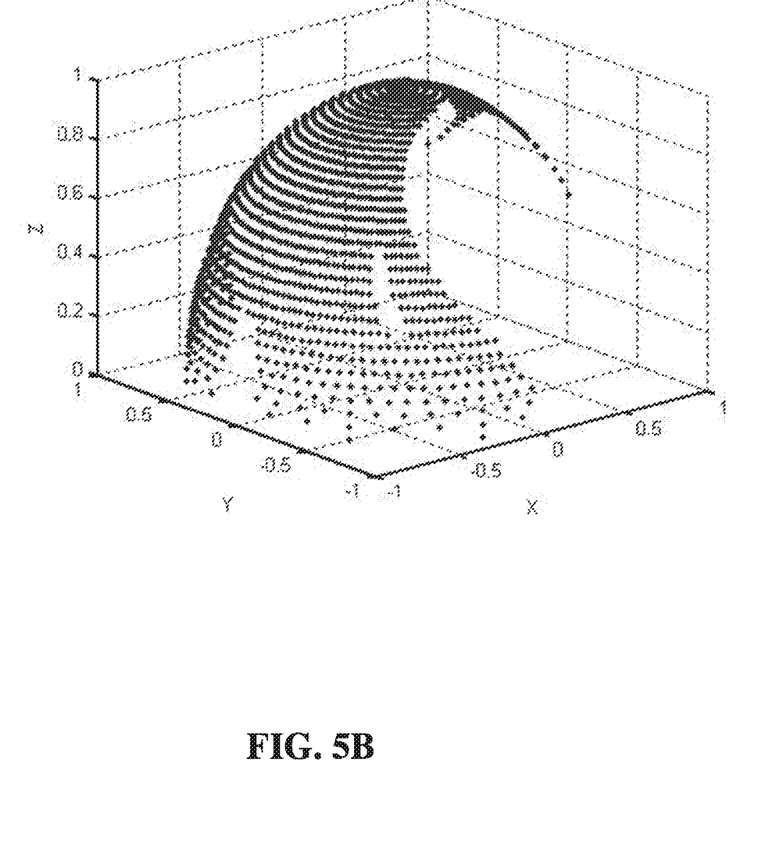
Figure 5C:
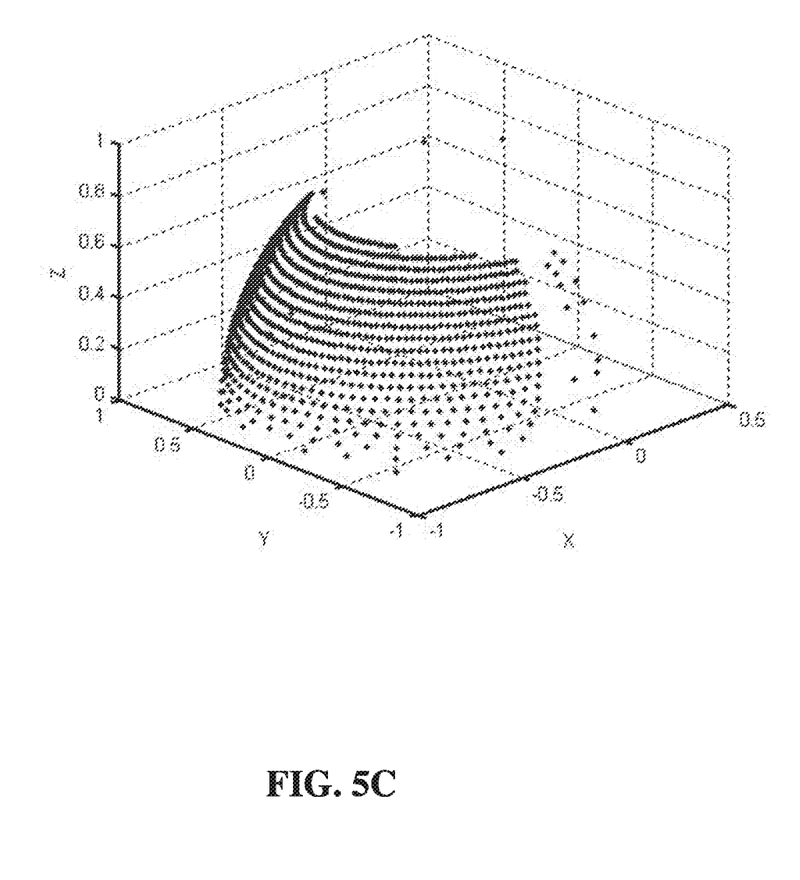

FIGS. 5A, 5B and 5C are simplified graphical illustrations of electrons detected by an electron detector within a hypothetical system (FIG. 5A), electrons detected by an electron detector within an electron detection system of FIG. 1 (FIG. 5B) and electrons detected by an electron detector within a standard FIB system (FIG. 5C).

The numerical calculation of electric and magnet fields was performed by a "Field Precision" commercial program. The program divided the space that effects the motion of the secondary electrons into many small boxes in the three dimensional space. Each box is represented by a point. Voltages or symmetry conditions were assigned to points that are on the electrodes, insulators, and boundaries that encompass the space in which the secondary electrons can propel. Magnetic materials and sources of magnetic fields were included. The program operates by finding a numerical solution for Poisson's equation and assigns each point in a space, in which the secondary electrons move, with a magnetic field direction and magnitude and electric field (generated by the detector and sparse grid) direction and magnitude. The trajectory of secondary electrons emitted at some angle with some initial energy from the point of ion impingement, is traced by following its path as it travels affected by the magnetic and electric field at each traversed box. Secondary electrons that reach the scintillation screen of the electron detector were noted. The calculation started by tracing each electron from a distribution of secondary electrons covering the polar and azimuthal angles of emission.

FIGS. 5A, 5B and 5C are graphical illustrations of "Acceptance Maps" plotted for each electron emitted at an initial energy, illustrating which of the secondary electrons emitted at a given initial energy and initial direction actually reached the detector. FIG. 5A is an illustration of an ideal hypothetical "Acceptance Map" wherein all the electrons emitted in a hemisphere about the normal to the surface of the sample, reach the detector. This shows the dependence of the electron collection on the original emission direction from the sample.

The "Acceptance Map" of FIGS. 5B and 5C were plotted for a typical FIB with 35 keV gallium ions at a working distance of 10 mm from the sample. The electron detector was positioned to the left of the FIB column at a lateral distance therefrom.

FIG. 5B was plotted in a FIB system with a deflecting field 150 generated by a pair of permanent magnets (170 in FIG. 1). The secondary electrons detected by the detector 124 are represented by points. From the larger portion of the hemisphere relative to FIG. 5C, it is evident that a large portion of secondary electrons emitted at acute angles relative to the sample beam axis 118 indeed reached the detector.

FIG. 5C was plotted is a standard FIB system absent the deflecting fields 150. Accordingly, FIG. 5C clearly shows that secondary electrons emitted at acute angles relative to the sample beam axis 118 did not reach the detector 124, as represented by the reduced points and vacuous portions of the hemisphere.

It was found that the detector collection efficiency in FIG. 5B was approximately double the detector collection efficiency in FIG. 5C. In some embodiments, approximately 100% of the secondary electrons emitted at acute angles can reach the detector 124.

The FIB system included the FIB column 112 housed in a chamber.

Example embodiments of the devices, systems and methods have been described herein. As may be noted elsewhere, these embodiments have been described for illustrative purposes only and are not limiting. Other embodiments are possible and are covered by the disclosure, which will be apparent from the teachings contained herein. Thus, the breadth and scope of the disclosure should not be limited by any of the above-described embodiments but should be defined only in accordance with claims supported by the present disclosure and their equivalents. Moreover, embodiments of the subject disclosure may include methods, systems and devices which may further include any and all elements/features from any other disclosed methods, systems, and devices, including any and all features corresponding to translocation control. In other words, features from one and/or another disclosed embodiment may be interchangeable with features from other disclosed embodiments, which, in turn, correspond to yet other embodiments. Furthermore, one or more features/elements of disclosed embodiments may be removed and still result in patentable subject matter (and thus, resulting in yet more embodiments of the subject disclosure).

What is claimed is:

1. An electron detection system for detecting secondary electrons emitted from a sample irradiated by a Focused Ion Beam (FIB), the FIB emanating from a FIB column and traveling along a beam axis within a beam region, which extends from a pole piece of the FIB column to the sample, comprising:
    an electron detector configured for detecting the secondary electrons, the electron detector positioned at a lateral distance away from the FIB column; and
    a deflecting field configured to deflect a trajectory of the secondary electrons, which were propagating towards the FIB column, to propel away from the beam axis and towards the electron detector, the deflecting field being configured to divert the trajectory of secondary electrons while the secondary electrons are generally within the beam region,
wherein the deflecting field is generated within the beam region.

2. An electron detection system according to claim 1, wherein the deflecting field comprises a magnetic field or an electric field.

3. An electron detection system according to claim 2, wherein the magnetic field is generated by a permanent magnet assembly.

4. An electron detection system according to claim 3, wherein the permanent magnet assembly comprises at least a pair of mutually spaced apart permanent magnets.

5. An electron detection system according to claim 2, wherein the magnetic field is generated by a coil assembly.

6. An electron detection system according to claim 5, wherein the coil assembly comprises at least a pair of mutually spaced apart coils.

7. An electron detection system according to claim 2, wherein the electric field comprises an electrical conductor.

8. An electron detection system according to claim 1, wherein the deflecting field is generally orthogonal to the beam axis.

9. An electron detection system according to claim 1, wherein the deflecting field comprises a magnetic field generated by at least a pair of magnets or coils and the magnetic field is generally confined to a space defined intermediate the pair of magnets or coils.

10. An electron detection system according to claim 1, wherein the deflecting field is configured such that its effect on the FIB is negligent or correctable.

11. An electron detection system according to claim 1, wherein the deflecting field is generated by a deflecting assembly, the deflecting assembly being physically coupled to the FIB column.

12. An electron detection system according to claim 1, wherein the deflecting field is generated by a deflecting assembly, the deflecting assembly being engaged with a holder of the sample, or with the electron detector.

13. An electron detection system according to claim 1, wherein an intensity of the deflecting field is adjusted to be compatible with a selected working distance between the FIB column and the sample.

14. An electron detection system according to claim 1, wherein an intensity of the deflecting field is adjusted to be compatible with a selected FIB parameter.

15. An electron detection system for detecting secondary electrons emitted from a sample irradiated by a Focused Ion Beam (FIB), the FIB emanating from a FIB column and traveling along a beam axis within a beam region which extends from the FIB column to the sample, the secondary electrons being detected by an electron detector positioned at a lateral distance away from the FIB column, comprising:
a deflecting field assembly configured to deflect a trajectory of the secondary electrons, which were propagating towards the FIB column, to propel away from the beam axis and towards the electron detector,
wherein the deflecting field assembly is positioned within the beam region.

16. A Focused Ion Beam (FIB) system, comprising:
a FIB column generating a FIB traveling along a beam axis within a beam region, which extends from the FIB column to a sample irradiated by the FIB;
an electron detector configured for detecting secondary electrons emitted from the sample, the electron detector positioned at a lateral distance away from the FIB column; and
a deflecting field assembly configured to generate a deflecting field which deflects a trajectory of the secondary electrons, which were propagating towards the FIB column, to propel away from the beam axis and towards the electron detector,
the deflecting field assembly being configured to divert the trajectory of secondary electrons while the secondary electrons are generally within the beam region,
wherein the deflecting field assembly is positioned within the beam region.

17. A method for detecting secondary electrons in a FIB system having a FIB emanating from a FIB column, comprising:
placing an electron detector at a lateral distance away from the FIB column; and
generating an electron deflection field to divert the secondary electrons towards the electron detector,
the electron deflection field magnitude is configured for generating a Larmor radius for the secondary electrons that is less than 1% of the Larmor radius of the FIB.

18. A method according to claim 17, wherein, the electron deflection field magnitude is configured to cause a FIB shift that is less than about 0.01% of a working distance between the FIB column and a sample emitting the secondary electrons.

19. A method according to claim 17, wherein the deflecting field comprises a magnetic field or an electric field.

20. An method according to claim 19, wherein the magnetic field is generated by either one of: a permanent magnet assembly or a coil assembly.

21. An electron detection system for detecting secondary electrons emitted from a sample irradiated by a Focused Ion Beam (FIB), the FIB emanating from a FIB column and traveling along a beam axis within a beam region, which extends from the FIB column to the sample, comprising:
an electron detector configured for detecting the secondary electrons, the electron detector positioned at a lateral distance away from the FIB column; and
a deflecting field configured to deflect a trajectory of the secondary electrons, which were propagating towards the FIB column, to propel away from the beam axis and towards the electron detector,
the deflecting field being configured to divert the trajectory of secondary electrons while the secondary electrons are generally within the beam region,
wherein the deflecting field comprises a magnetic field or an electric field, and
wherein the deflection field magnitude is configured for generating a Larmor radius for the secondary electrons that is less than 1% of the Larmor radius of the FIB.

22. A deflecting field assembly configured to generate a deflecting field, comprising:
one of a magnetic field assembly and an electric field assembly,
wherein the deflecting field is configured to deflect secondary electrons emitted from a sample irradiated by a Focused Ion Beam (FIB) and propagating towards a FIB column,
wherein the FIB emanates from the FIB column and travels along a beam axis within a beam region,
wherein the beam region extends from the FIB column to the sample, wherein the deflecting field is configured to deflect a trajectory of the secondary electrons by propelling the secondary electrons away from the beam axis and towards an electron detector positioned at a lateral distance away from the FIB column, and wherein the one of a magnetic field assembly and the electric field assembly is positioned within the beam region.

23. The deflecting field assembly according to claim 22, further comprising attachment means for physically coupling the deflecting field assembly to the FIB column.

* * * * *